United States Patent [19]

Fortune

[11] Patent Number: 4,926,028
[45] Date of Patent: May 15, 1990

[54] HOT AIR HEATED SOLDERING INSTRUMENT

[76] Inventor: William S. Fortune, 29866 Cuthbert St., Malibu, Calif. 90265

[21] Appl. No.: 47,771

[22] Filed: May 8, 1987

Related U.S. Application Data

[60] Continuation of Ser. No. 665,725, Oct. 29, 1984, abandoned, which is a continuation-in-part of Ser. No. 625,449, Jun. 27, 1984, abandoned, which is a division of Ser. No. 471,098, Mar. 1, 1983, abandoned.

[51] Int. Cl.⁵ .......................... B23K 3/02; H05B 3/00; F24H 1/10
[52] U.S. Cl. .................................. 219/230; 219/229; 219/241; 219/373; 219/379; 219/381; 228/53
[58] Field of Search ................... 219/227–232, 219/236–241, 367, 368, 373–376, 379–382; 228/51–55, 20, 21

[56] References Cited

U.S. PATENT DOCUMENTS

| | | | |
|---|---|---|---|
| 1,188,952 | 6/1916 | Laird | 219/230 UX |
| 1,227,324 | 5/1917 | Russell et al. | 219/381 |
| 1,252,614 | 1/1918 | Pieper et al. | 219/379 |
| 1,369,935 | 3/1921 | Pieper et al. | 219/379 |
| 1,955,240 | 4/1934 | Kenney | 219/230 UX |
| 2,028,095 | 1/1936 | Tully et al. | 219/379 |
| 2,819,378 | 1/1958 | Nokes et al. | 219/367 |
| 3,109,912 | 11/1963 | Cerulli | 219/230 UX |
| 3,422,247 | 1/1969 | Royston et al. | 219/373 X |
| 3,560,710 | 2/1971 | Fuellemann | 219/373 |

FOREIGN PATENT DOCUMENTS

| | | | |
|---|---|---|---|
| 323684 | 9/1957 | Switzerland | 219/230 |
| 400548 | 4/1966 | Switzerland | 219/373 |
| 578169 | 10/1977 | U.S.S.R. | 219/373 |
| 21997 | of 1914 | United Kingdom . | |

*Primary Examiner*—Anthony Bartis
*Attorney, Agent, or Firm*—Daniel T. Anderson

[57] ABSTRACT

A desoldering system utilizes a hot air soldering instrument which includes a hollow elongated cylindrical heating element capable of generating a high temperature. The cold input air is forced to move about the outer surface of the heating element. It is then directed to move between the inner surface of the heating element and the outer surface of an inner tube, whereby a primary and a secondary heating chamber are provided. In each heating chamber an open coil form or spring may be disposed to further increase the tortuous path of the air, and the heated air exits from the inner tube into a soldering tip from it is discharged, thus to provide a very hot air jet for soldering or desoldering purposes. Various modified instruments are disclosed for permitting either a hot air jet tip or a conventional soldering tip to be used. Also, a permanent air connection is featured in another modification to obviate the necessity of disassembling the air hose and other connections.

2 Claims, 5 Drawing Sheets

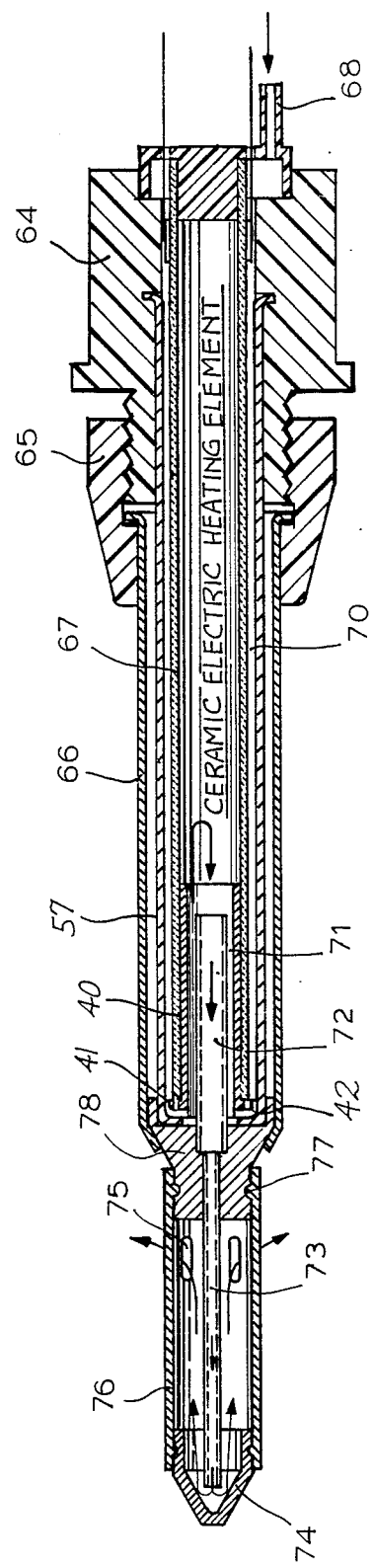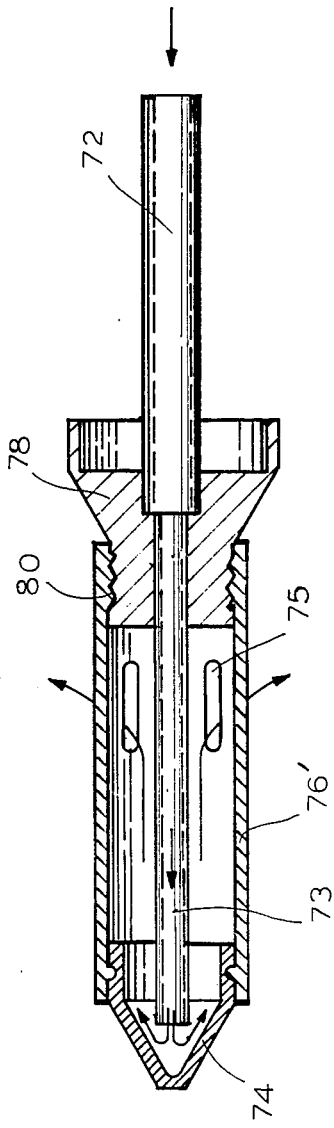
FIG. 5
FIG. 6

HOT AIR HEATED SOLDERING INSTRUMENT

CROSS-REFERENCE TO RELATED APPLICATION

The present application is a continuation of application Ser. No. 665,725, filed Oct. 29, 1984, which was a continuation-in-part of a divisional application, Ser. No. 625,449, filed on June 27, 1984. This divisional application was carved out of an original application, Ser. No. 471,098, filed on March 1, 1983. Each of these related applications is now abandoned.

This invention relates generally to the art of soldering and particularly relates both to a soldering system and a desoldering instrument.

Generally, electric components mounted on a printed circuit board which need to be replaced are being desoldered by means of an electric soldering instrument. Hence, from the hot tip of the instrument the heat is transferred by conduction to the solder, until the solder melts. However, since the heat is transferred by conduction, other components and even other pieces of solder are being heated, which may destroy other components and may liquify the solder where such a result is not desired.

It has been found in the past that a hot air soldering instrument avoids many of these disadvantages. The hot air jet heats only that portion of the solder upon which the hot air jet is directed. Hence, there is less chance that other components on a printed circuit board, for example, are inadvertently heated and possibly damaged.

However, the difficulty with many hot air soldering instruments designed in the past has been that it is not possible to generate a satisfactorily hot air jet. A very hot air jet is needed to liquify quickly the solder, to speed up the work and to minimize damage to adjacent components.

It is accordingly an object of the present invention to provide a hot air soldering instrument which generates a very hot jet of air.

It has also been found that a hot air jet is ideally suited for directly heating a soldering tip of a soldering instrument, rather than being expended as a hot air jet into the air. It has been found that the hot air jet may very readily heat a soldering tip or desoldering tip, as the case may be, without the usual time delay encountered when the tip is heated directly from the heating element through a conventional heat path. Furthermore, in this case there is no necessity to utilize copper in the soldering tip, the copper being heavy and expensive, as well as being subject to rapid decay by oxidation and the like

SUMMARY OF THE INVENTION

The soldering instrument in accordance with the present invention includes a hollow heating element which is enclosed by a heating element retainer sleeve. Within the hollow heating element is a hollow tube. Accordingly, a primary heating chamber, or primary plenum, is provided between the heating element retainer sleeve and the outer surface of the heating element. A secondary heating chamber, or secondary plenum, is provided between the inner surface of the heating element and the outer surface of the inner tube.

Preferably a suitable open-coil spring or other helical form is disposed in the primary heating chamber and another in the secondary heating chamber. This will provide a tortuous path for the cold air, to increase its time of passage in the proximity of the heating element. The thus-heated air jet then issues from a jet tip, which may be directed upon the solder to be liquified.

In case the instrument is utilized for directly heating the soldering tip by the hot air jet, the construction may be greatly simplified, because there is no necessity for a metal heat path between the heating element and the soldering tip.

The novel features that are considered characteristic of this invention are set forth with particularity in the appended claims. The invention itself, however, both as to its organization and method of operation, as well as additional objects and advantages thereof, will be best understood from the following description when read in connection with the accompanying drawings.

BRIEF DESCRIPTION OF THE DRAWINGS

FIG. 2a is an exploded view of a modification of the instrument of FIG. 2;

FIG. 5 is a cross-sectional view of an instrument for heating a soldering tip with hot air and being provided with a plurality of exhaust vents which may be utilized for removing or expelling fumes and other obnoxious gases which may be created by the soldering operation;

FIG. 6 is a somewhat enlarged view of a modification of the front end of the instrument of FIG. 5.

DETAILED DESCRIPTION OF THE DRAWINGS

Figure 1:
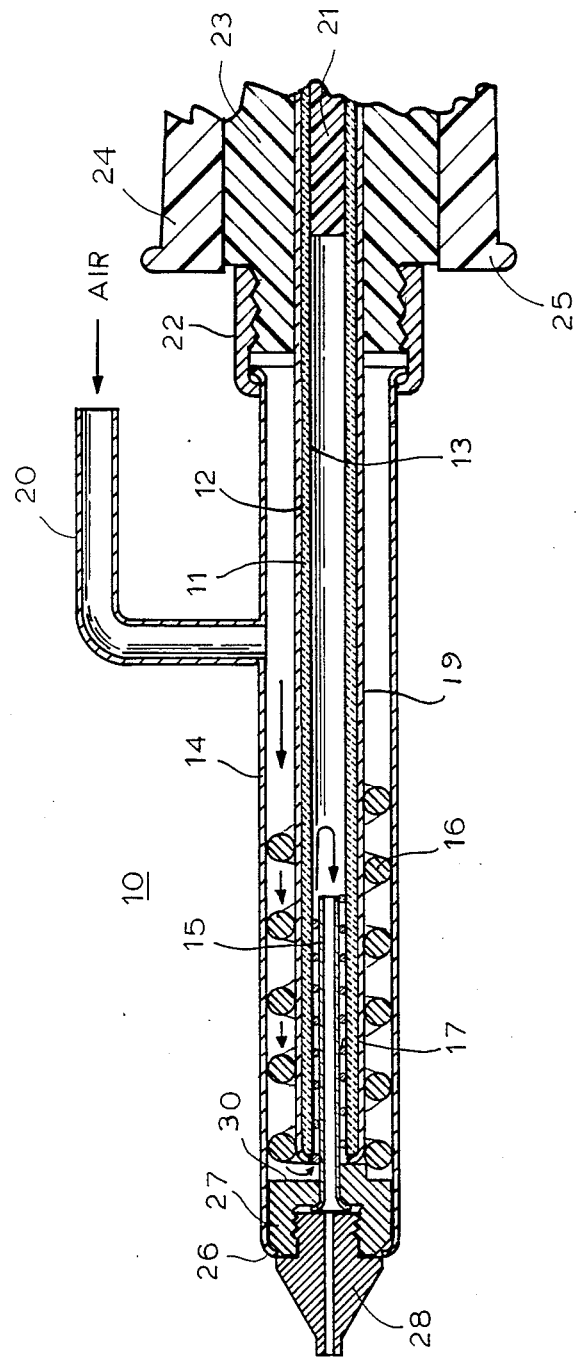
FIG. 1 is a cross-sectional view of the front end of a hot air soldering instrument of the present invention for generating a hot air jet.

In accordance with the present invention, an improved hot air soldering instrument is disclosed in section in FIG. 1. It is to be understood that throughout this specification and claims gases other than air per se may be utilized in particular applications for particular purposes. Accordingly, when air is recited herein, it is intended as a generic term for gaseous state material and is intended to include, for example, inert or relative inactive gases such as nitrogen or the noble gases. The instrument 10 of FIG. 1 includes a heating element 11 which is of cylindrical form and elongated. The heating element 11 is preferably made of a ceramic that is obtainable from Kyocera in Kyoto, Japan, Model No. F1495. As will be presently explained, the heating element 11 will generate a very high temperature, so as to obtain a very hot air jet. The heating element 11 has an outer surface 12 and and inner surface 13. A metal tube 19 encloses the heating element 11 and surrounds the outer surface 12. It is surrounded by a heating element retainer sleeve 14, but spaced therefrom. Disposed within the heating element 11 is an inner tube 15 which is also hollow and may extend over only a portion of the heater element. A first open helical form or coil spring 16 is preferably disposed in the space between the outer surface of the tube 19 and the inner surface of the heating element retainer sleeve 14.

Another open coil 17 is preferably disposed in the space between the outer surface of the inner tube 15 and the inner surface 13 of the heating element 11. The space occupied by the larger coil 16 may be called the primary heating chamber, or outer air plenum, and is disposed between the outer surface 12 of the heating element 11 and the inner surface of the outer tube 19. By means of the two coil springs 16 and 17 a tortuous path is provided for the compressed and cold air which enters through the connection or elbow 20. This, in turn, will increase the dwell time of the air in the chamber and, hence, will permit the air to assume a high temperature.

It should be noted that the springs 16 and 17 in the inner and outer air plenum may be omitted. This is particularly true when the temperature of the resulting hot air jet need not be quite as hot as can otherwise be obtained. Also, in certain modifications of the instrument described herein, the inner air plenum may not have a diameter large enough to accommodate such a coil spring.

The rear portion of the heating element 11 is closed by a plug 21 which may, for example, consist of a potting agent. The space between the heating element 11 and its retainer sleeve 14 is closed by a sleeve retainer cinch nut 22 which is internally threaded to match the external threads of a bushing 23 forming part of the housing of the instrument, which may be surrounded by an outer sleeve 24, forming part of the handle and having a forward flange 25. The forward end of the retainer sleeve 14 is inwardly bent, as shown at 26. It serves to retain an end cap 27 which is inwardly threaded to receive the hot jet tip 28, which is outwardly threaded. A portion of the end cap 27 bears against the forward end of the heating element 11. This will permit the ready exchange of the hot jet tip for another one of different design or to replace a damaged tip.

It will be noted that the end cap 27 has a rearwardly recessed portion 30. This will permit air to flow from the elbow 20 through the primary heating chamber, into and through the secondary heating chamber, and then out through the inner tube 15 and the jet tip 28.

Preferably, the cinch nut 22, the end cap 27, the jet tip 28 and the inner tube 15 should be made of stainless steel, to withstand the high temperatures present. The two coil springs should also consist of high-temperature resistant material such as inconel, which is an alloy of nickel, chromium and iron (alloy 600). The temperature inside the heating element 11 may be as high as 850° C., while the temperature of the hot air leaving the jet tip 28 may be 425° C. The pressure of the cold air entering the elbow 20 may, for example, be 10 psi (pounds per square inch).

It should be noted that the replaceable hot jet tip 28 also retains the inner tube 15. The cinch nut 22 secures the hot air attachment and provides an air-tight seal with the threaded bushing 23.

The hot air desoldering instrument of the invention may also be utilized with advantage for removing a flat pack in a dual-in-line (DIP) pin packaging. In this case the entire area of the pins and solder may first be gently heated to minimize thermal shock to the individual components. Thereafter, the individual soldering areas may be heated to liquify and remove the solder.

Figure 2:
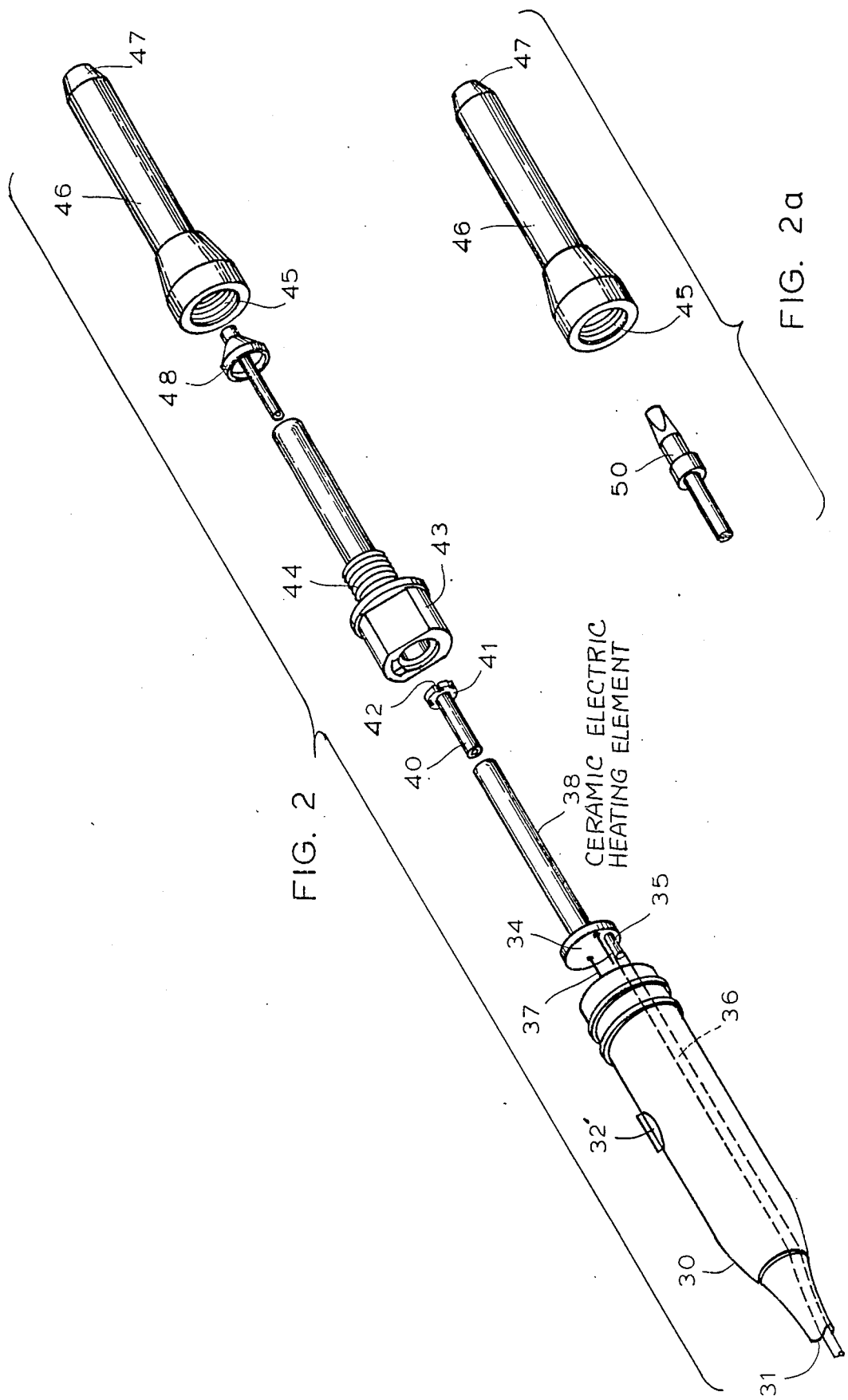
FIG. 2 is an exploded view of a preferred form of the instrument of the invention, parts being omitted for clarity.

Referring now to FIGS. 2 and 2a, there is illustrated what is presently considered the preferred embodiment of the present invention. It has the advantage that it may be operated both with a hot air jet for heating the soldering tip, or else for heating the soldering tip in the conventional manner; that is, by direct heat transfer.

Figure 4:
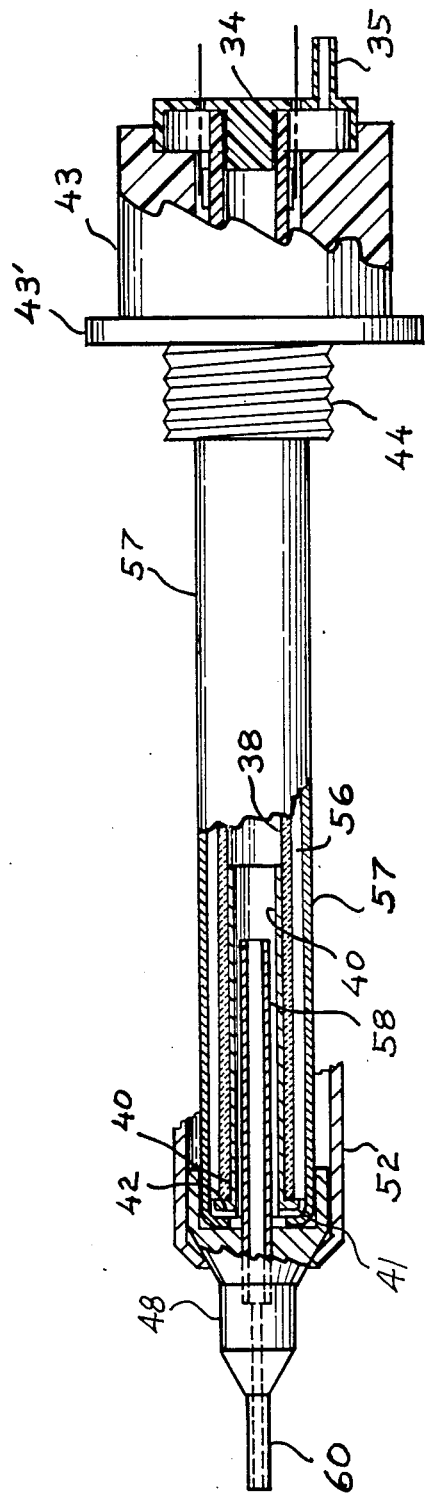
FIG. 4 is a cross-sectional view on enlarged scale corresponding to the front end of FIG. 3.

Thus, referring to FIG. 2, which is an exploded view of the invention, a handle 30 through which an electric cable or cord 31 may extend is shown. The handle 30 also has an opening 32' for setting a desired temperature, which is then maintained by the control circuit in the handle 30. In the far end of the handle 30 there is provided an end cap 34 which has a miniature air connecting pipe 35 for connecting thereto a thin air hose, shown at 36. A pair of electric wires, shown at 37, extends through the end cap 34. A hot air tube 40, which fits into a ceramic heating element 38, has a disk-like extension 41 with radial and axial slots 42 which permit the air to pass as shown in FIG. 4. The entire assembly passes through a bushing 43 having an external thread 44 facing away from the handle 30 and meshing with an internal thread 45 of a tip retainer sleeve 46. The outer end 47 of the tip retainer sleeve 46 is inwardly curved to retain the hot jet tip 48 through which the hot air jet issues and which may be of generally conical shape. The outer sleeve 24 and cinch nut 22 of FIG. 1 have been omitted from FIG. 2 for clarity.

The instrument of FIG. 2, shown in exploded view, may be assembled as follows. The hot air tube 40 is inserted into tho hollow heating element 38. The assembly of elements 38, 40 is inserted into the bushing 43. The end cap 34 is then glued or otherwise rigidly connected to the bushing 43. Then the hot jet tip 48 is inserted into the tube 57 extending from the bushing 43. The hot jet tip 48 extends into the sleeve 46 and is held and prevented from further movement by its outer end 47.

The electric wires 37 extending from the end cap 34 may then be inserted into the handle 30. At the same time the air connecting pipe 35 and its air hose 36 are also extended into the handle 30 and the assembly is complete.

Compressed air is now impressed through the tube 36 and the air connecting pipe 35, over the hollow heating element 38, through the slots 42 and around the outer disk 41, back over the hot air tube 40, and finally forwardly again through the tube 40 toward the soldering tip 48.

Instead of using the hot jet tip 48, as shown in FIG. 2, it is also feasible to provide a spade tip 50, which is a conventional soldering tip of the type shown in FIG. 2a. The spade tip fits into the hot air tube 40, and its outer end is held by the inwardly curved portion 47 of the retainer sleeve 46. The sleeve 46 may be secured by its threads 45 to the exterior threads 44 of the bushing 43. The hot air jet which is obtained in the manner just described will hit the inner surface of the conventional spade tip 50 to heat it to the desired temperature.

Figure 3:
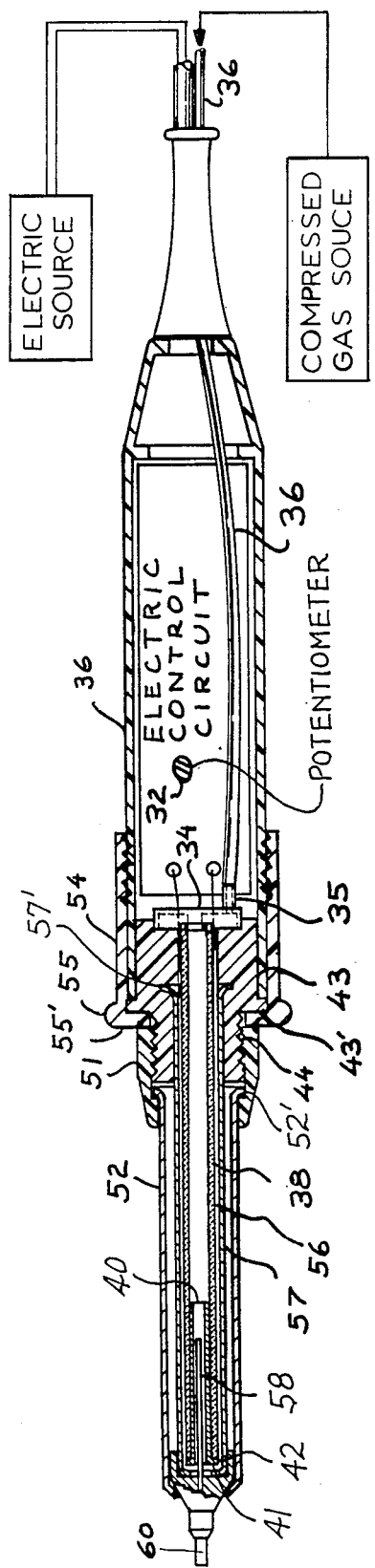
FIG. 3 is a cross-sectional view of the front end of an instrument which may be used either for directly heating a soldering tip or else for generating a hot air jet, all the parts for the hot air jet being built into the instrument.

Reference is now made to FIGS. 3 and 4, which illustrate a longitudinal section of an instrument similar to that previously shown in FIG. 2. In this instance the instrument has a separate, sleeve retainer nut 51 which is attached to a retainer sleeve 52. The heating element itself is shown at 38. A collar 54 has a front end disk or flange 55 to bear against the retainer nut 51. The air first enters an outer heating plenum 56 (defined by the annular space between the heating element 38 and an inner sleeve 57). The air, being heated as it passes forwardly over the ceramic heating element 38 eventually reverses, turns radially inwardly through the slots 42 of the hot air tube 40, is turned rearwardly to pass through the tube 40, and then finally is turned radially inwardly and forwardly to pass through a relatively thin tube 58 located at the front end to feed a hot jet of air to the jet air tip 60. The connection of the cold air through the end cap 34 and the air connecting pipe 35 is shown and explained in connection with FIG. 2.

It will be noted that the inner sleeve 57 is swaged or flared at its rear end where it may be molded into the bushing 43. The outer sleeve 52 may be similarly flared and abut the front surface of the bushing 43; it also bears against the cinch nut 51, which, in turn, retains it. The cinch nut 51, in turn, may bear against the flange 55. It may be noted, for completeness, that the collar 54 includes an outwardly extending flange 55 at its forward end for utility and safety to the operator in handling the instrument. A radially inwardly extending flange 55' at the same end serve to retain the bushing 43 within the handle 36. To accomplish this retaining function, the collar 54 may be threadingly engaged in conventional manner over the forward end of the handle 36.

It should also be noted that a potentiometer 32 is shown in the interior of the handle 36. This serves to set or adjust the desired temperature. It will be noted that the potentiometer 32 communicates with the opening 32' on the handle 36 of FIG. 2.

It will thus be understood that this modification generates a hot air jet, rather than a soldering tip heated by hot air.

An enlarged front portion of the instrument of FIG. 3 is shown in FIG. 4. The end cap 34 may again be provided with an air connection pipe 35 and the bushing 43 with a retaining shoulder front end 43' and outer threads 44.

The air which has been heated by passage through an inner and an outer heating plenum passes through the thin tube 58 and exits through the hot air nozzle 60. The construction is the same as that of FIG. 3.

Turning now to FIGS. 5 and 6, cross-sectional views of a modification of the present invention which is primarily adapted for rapidly heating a soldering tip by hot air are shown. In both cases it will be noted that there is a relatively long path between the end of the heating element 67 and the soldering tip 74. In accordance with the present invention this long path is readily bridged by a hot air jet.

It will be noted that even a long hot air heating path is effectively shorter than a corresponding solid metallic or other heat conducting connection, the reason being that the entire length of the solid material must first be heated to its far end to be able to heat the soldering tip. This requires a considerable amount of time and consumes a considerable amount of energy.

On the other hand, if such a long heating path is bridged by a hot air jet, the hot air jet loses no significant quantity of heat and its far end is substantially as hot as the near end.

This, in turn, means that the soldering tip can be rapidly heated, even though it may desireably cool down quickly when the cold air supply is interrupted. When the cold air supply is reconnected a new hot air jet is rapidly obtained. The soldering tip is then very quickly reheated. This feature significantly extends the useful life of the soldering tip and minimizes corrosion and oxidation caused by its high temperature environment and contact with the solder.

Referring now to FIGS. 5 and 6 and particularly to FIG. 5, there is illustrated the bushing 64 followed by a sleeve retainer cinch nut 65 which is flare-connected to the heating element retainer sleeve 66 housing the heating element 67. The air enters through the air connecting pipe 68 and flows along an outer heating plenum 70 defined by the annular space between the heating element 67 and the inner sleeve 57. From there it travels forwardly through the slots 42 of the heater tube 40 and then reverses direction and returns through the heating plenum 71 within the heater tube 40 and eventually forwardly again through a hot air feed tube 72. From there it goes through a hot air fountain, tube 73, so called because the hot air leaves it in much the same manner as water leaves a fountain. The contact between the fountain of hot air and the soldering tip 74 causes a transfer of heat thereto and raises its temperature to essentially that of the hot air.

The air after heating the tip exits through vents 75 and in the process may blow away from the work fumes and other obnoxious gases generated by the solder melting operation. It is to be especially noted that the hot air transfer tube 73 solely directs and focuses the hot air jet and does not serve as a conventional heat conduction path.

It should be noted that the outer sleeve 76 is rolled or otherwise permanently connected, as shown at 77, to the tip retaining stem 78. Hence, the soldering tip 74 is replaced by removing the outer sleeve 76 and the tip retaining stem 78.

Another modification which creates a releasable connection is shown in FIG. 6. Instead of the rolled connection 77, a screw thread 80 is provided between the outer sleeve 76' and the tip retaining stem 78'. This permits very efficient exchange or repair of the soldering tip.

It should be noted that this construction has various particular advantages; that is, there is direct heating at the inner surface of the soldering tip, which provides faster recovery. The tip may readily be replaced, and it need not be plated, thereby reducing its cost. The fumes are blown away from the assembly. A particular advantage is the fact that there is no need to utilize copper for the soldering tip. This, in turn, reduces the weight of the tip, as well as minimizing the troublesome rapid oxidation, while at the same time reducing energy consumption. Also, a closer temperature control under load conditions is obtained.

Figure 7:
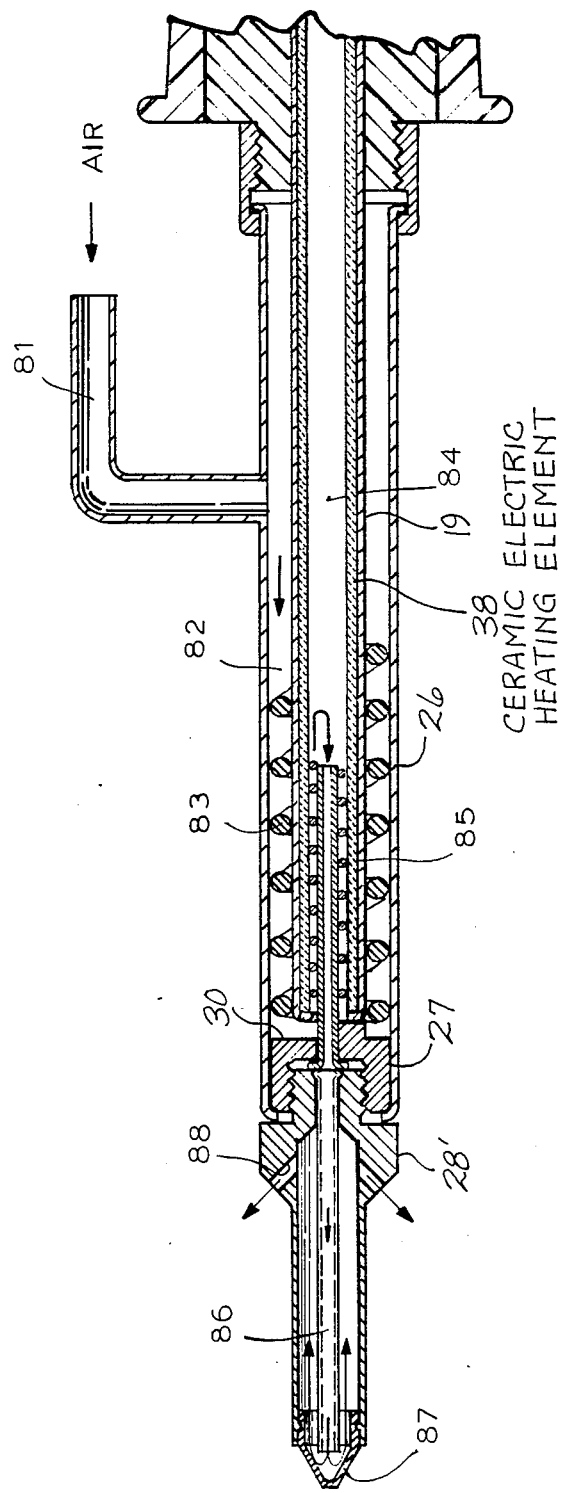
FIG. 7 is still another modification of the instrument of the invention for heating a soldering tip through a relatively long path.

A modification of the instrument of FIGS. 5 and 6 is shown in FIG. 7, where the air may enter through an elbow 81 into an outer heat exchange plenum 82, which may be provided with a coil 83. From there the preheated air reaches the inner heat exchange plenum 84, which may also be provided with a coil spring 85. The hot air then passes through a fountain tube 86 for heating the soldering tip 87. The spent air may leave the structure through suitable, forwardly directed air vents 88. The remainder of the construction may be essentially the same as shown, for example, in FIGS. 5 and 6.

In all embodiments of the invention discussed herein the hot air jet is obtained in substantially the same manner as in FIG. 1. In other words, the cold air is rapidly heated in a tortuous path about the outer surface and subsequently through the hollow interior of the heating element. Thereafter it is directed toward a hot air tip or a conventional soldering tip.

Preferably the soldering tip may be made of a corrosive-resisting material such as 303 CRES, which means "corrosion-resisting stainless steel".

What is claimed is:

1. Hot air soldering - desoldering instrument comprising:

A. a handle body having disposed near its rear end a first input means for receiving gas from a pressurized supply and a second input means for receiving electrical energy from an electric source;

B. air heating apparatus carried by said handle near its front end and including i. an outer tubular metallic support sheath carried by said handle body and extending forwardly therefrom and having a solder tip retaining means disposed at its forward end, ii. an inner metallic support sheath carried by said handle body and extending forwardly therefrom concentrically within and radially spaced from said outer sheath and terminating in a forward end axially contiguous to said solder tip retaining means, iii. a ceramic hollow cylindrical heating element support member carried by said handle body and extending forwardly therefrom concentrically within said inner sheath and terminating axially near but spaced axially from its said forward end to define a radial, hot gas passage gap, iv. a deposited heating element disposed about the forward end portion of said hollow ceramic member and extending rearwardly to define a predetermined heater length and being coupled to said second, electrical, input means of said handle body, v. an inner, hot gas tube carried by the forward end of at least one of said metallic support sheaths and extending concentrically rearwardly within said hollow ceramic member to at least substantially the rearward extent of said predetermined heater length.

the radial spacing between said ceramic heating element support member and said inner support sheath forming a first, outer heat exchange plenum, that between said inner, hot gas tube and said ceramic heating element support member forming a second, inner heat exchange plenum, and the two such plenums being gas flow coupled at their forward ends by said radial, hot gas passage gap over the forward end of said ceramic member, and vi. gas flow connection means disposed at the rear of said first, outer heat exchange plenum for coupling said first plenum to said first gas receiving input means of said handle body; and C. a soldering tip carried by said solder tip retaining means of said outer metallic support sheath and having an axial nozzle bore therethrough air flow coupled to the forward end of said inner, hot gas tube for providing a highly heated jet of gas for soldering-desoldering purposes.

2. A hot air soldering instrument comprising:

A. a hollow cylindrical heating element;

B. an outer cylindrical retainer sleeve having front and rear ends and housing said heating element and being radially spaced therefrom;

C. an inner hollow cylindrical tube disposed within said heating element and being radially spaced therefrom and having open front and rear ends, said retainer sleeve, said heating element, and said inner tube being disposed in nested, radially spaced relation to define i. a primary heating passage having front and rear ends and disposed between the outer surface of said heating element and the inner surface of said retainer sleeve and ii. a secondary heating passage having front and rear ends and disposed between the inner surface of said heating element and the outer surface of said inner tube, said rear ends of said primary and secondary heating passages being essentially closed and said front ends thereof being in flow communication with each other, and said rear end of said secondary passage being in flow communication with the interior of said inner tube;

D. a hot air tip carried by said front end of said outer retainer sleeve and disposed contiguously to said front ends of said heating passages in flow communication with the interior of said inner tube and having an outlet for the discharge of heated air;

E. supply means connected to said rear of said primary passage for feeding compressed air thereto and providing (1) a flow thereof through said passages and the interior of said inner tube and (2) a discharge thereof from said outlet of said hot air tip;

F. a hollow handle having a front end;

G. a cinch nut for supportively connecting said rear end of said retainer sleeve to said front end of said handle; and H. an electronic control circuit housed within said hollow handle and coupled to said heater element for energizing it and controlling its temperature.

* * * * *